United States Patent
Lee

(10) Patent No.: US 10,031,702 B2
(45) Date of Patent: Jul. 24, 2018

(54) NONVOLATILE MEMORY AND A NONVOLATILE MEMORY SYSTEM

(71) Applicant: SAMSUNG ELECTRONICS CO., LTD., Suwon-si, Gyeonggi-Do (KR)

(72) Inventor: Yongjun Lee, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/606,659

(22) Filed: May 26, 2017

(65) Prior Publication Data

US 2018/0059993 A1    Mar. 1, 2018

(30) Foreign Application Priority Data

Aug. 29, 2016 (KR) .................... 10-2016-0110182

(51) Int. Cl.
| | | |
|---|---|---|
| G11C 16/04 | (2006.01) | |
| G06F 3/06 | (2006.01) | |
| G06F 12/02 | (2006.01) | |
| G11C 11/56 | (2006.01) | |
| H01L 29/66 | (2006.01) | |

(52) U.S. Cl.
CPC ........ G06F 3/0688 (2013.01); G06F 12/0246 (2013.01); G11C 11/5628 (2013.01); G11C 11/5642 (2013.01); H01L 29/66545 (2013.01); H01L 29/66825 (2013.01)

(58) Field of Classification Search
CPC .............. G06F 3/0688; G06F 12/0246; G11C 11/5628; G11C 11/5642; H01L 29/66545; H01L 29/66825

USPC .................................................... 365/185.17
See application file for complete search history.

(56) References Cited

U.S. PATENT DOCUMENTS

| | | | |
|---|---|---|---|
| 5,555,204 | A | 9/1996 | Endoh et al. |
| 7,130,997 | B2 | 10/2006 | Hsu et al. |
| 7,299,314 | B2 * | 11/2007 | Lin .................... G11C 16/0416 365/185.01 |
| 7,885,141 | B2 | 2/2011 | Kang |
| 8,978,156 | B2 | 3/2015 | Saito |
| 9,189,639 | B2 | 11/2015 | Tokumoto |

(Continued)

FOREIGN PATENT DOCUMENTS

| | | |
|---|---|---|
| JP | 2003203012 | 7/2003 |
| JP | 2005196595 | 7/2005 |

(Continued)

*Primary Examiner* — Pho M Luu
*Assistant Examiner* — Xiaochun L Chen
(74) *Attorney, Agent, or Firm* — F. Chau & Associates, LLC

(57) ABSTRACT

A nonvolatile memory including: a memory cell array including a plurality of nonvolatile memory cells; a decoder connected to the memory cell array through a plurality of word lines; a data input/output (I/O) circuit connected to the memory cell array through a plurality of bit lines; and control logic configured to control the decoder and the data I/O circuit in response to a change in a power supply voltage to clear or maintain individual pieces of page data. The control logic includes a page management unit that determines whether to clear data included in the individual pieces of page data based on a value of a set flag respectively corresponding to the individual pieces of page data.

20 Claims, 9 Drawing Sheets

(56) References Cited

U.S. PATENT DOCUMENTS

| | | | |
|---|---|---|---|
| 2005/0144362 A1* | 6/2005 | Lin | G11C 16/0416 |
| | | | 711/103 |
| 2006/0002197 A1* | 1/2006 | Rudelic | G11C 16/102 |
| | | | 365/189.09 |
| 2006/0133155 A1 | 6/2006 | Fujita et al. | |
| 2008/0256352 A1 | 10/2008 | Chow et al. | |

FOREIGN PATENT DOCUMENTS

| JP | 2005236782 | 9/2005 |
|---|---|---|
| JP | 2012178189 | 9/2012 |

* cited by examiner

NONVOLATILE MEMORY AND A NONVOLATILE MEMORY SYSTEM

CROSS-REFERENCE TO RELATED APPLICATION

This application claims priority under 35 U.S.C. § 119 to Korean Patent Application No. 10-2016-0110182 filed Aug. 29, 2016, in the Korean Intellectual Property Office, the disclosure of which is incorporated by reference herein in its entirety.

TECHNICAL FIELD

The inventive concept described herein relates to a memory device, and more particularly, to a nonvolatile memory and a nonvolatile memory system.

DISCUSSION OF RELATED ART

A semiconductor memory may be implemented by using a semiconductor such as silicon (Si), germanium (Ge), gallium arsenide (GaAs), and/or indium phosphide (InP), for example. Semiconductor memory devices may be classified as a volatile memory device or a nonvolatile memory device.

The volatile memory device loses stored data when it is powered-off. The volatile memory device includes a static random access memory (SRAM), a dynamic RAM (DRAM), a synchronous DRAM, and the like. The nonvolatile memory device retains stored data even when it is powered-off. The nonvolatile memory device includes a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

A main memory is used for processing important data. A main memory may use a volatile memory device for security purposes. In the case where a volatile memory such as a DRAM is used as a main memory, data stored in the main memory needs to be periodically refreshed. In addition, data stored in the volatile main memory is lost during power-off. Accordingly, a nonvolatile memory device, such as a flash memory device, a PRAM, an MRAM, or an RRAM, which retains stored data even at power-off and which has a high processing speed, is being considered for use as the main memory.

SUMMARY

According to an exemplary embodiment of the inventive concept, there is provided a nonvolatile memory comprising: a memory cell array comprising a plurality of nonvolatile memory cells; a decoder connected to the memory cell array through a plurality of word lines; a data input/output (I/O) circuit connected to the memory cell array through a plurality of bit lines; and control logic configured to control the decoder and the data I/O circuit in response to a change in a power supply voltage to clear or maintain individual pieces of page data, wherein the control logic comprises a page management unit that determines whether to clear data included in the individual pieces of page data based on a value of a set flag respectively corresponding to the individual pieces of page data.

According to an exemplary embodiment of the inventive concept, there is provided a memory system comprising: a nonvolatile memory; and a memory controller configured to control the nonvolatile memory to clear or maintain page data written in a plurality of pages in response to a change in a power supply voltage, wherein the memory controller comprises a page management unit configured to determine whether to clear the page data, based on a value of a set flag respectively corresponding to individual pieces of the page data.

According to an exemplary embodiment of the inventive concept, there is provided a nonvolatile memory comprising: a memory cell array; a decoder connected to the memory cell array via word lines; a data input/output (I/O) circuit connected to the memory cell array via bit lines; and control logic circuit configured to clear individual pieces of page that have a corresponding set flag of a first logical value and to maintain individual pieces of page data that have a corresponding set flag of a second logical value, wherein the page data is cleared or maintained in response to a signal indicative of a power supply voltage change.

BRIEF DESCRIPTION OF THE FIGURES

The above and other features of the inventive concept will become more apparent by describing in detail exemplary embodiments thereof with reference to the following figures, in which.

DETAILED DESCRIPTION OF THE EMBODIMENTS

Figure 1:
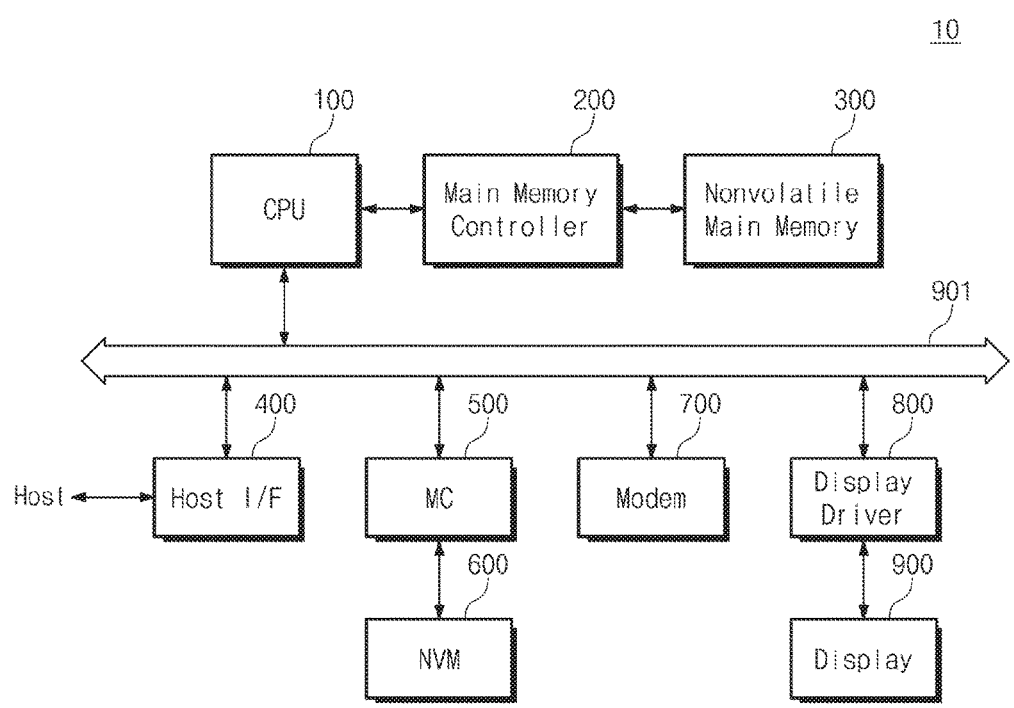
FIG. 1 is a block diagram illustrating a memory system, according to an exemplary embodiment of the inventive concept.

Below, exemplary embodiments of the inventive concept will be described more fully with reference to the accompanying drawings. In the drawings, like reference numerals may refer to like parts.

FIG. 1 is a block diagram illustrating a memory system 10, according to an exemplary embodiment of the inventive concept.

Referring to FIG. 1, the memory system 10 includes a central processing unit (CPU) 100, a main memory controller 200, a nonvolatile main memory 300, a host interface 400, a memory controller 500, a nonvolatile memory 600, a modem 700, a display driver 800, and a display 900.

The memory system 10 may allow the CPU 100, the main memory controller 200, the host interface 400, the memory controller 500, the modem 700, and the display driver 800 to exchange data with each other through a system bus 901.

Data that is provided through the host interface 400 or processed by the CPU 100 is stored in the nonvolatile main memory 300.

The CPU 100 controls overall operations of the memory system 10. For example, the CPU 100 controls each element of the memory system 10 such that a write operation, a read operation, or an arithmetic operation is performed in response to a request. The request may be an external request.

The main memory controller 200 controls the nonvolatile main memory 300 in response to receiving a write command from the CPU 100 such that write data is stored in the nonvolatile main memory 300. In addition, the main memory controller 200 controls the nonvolatile main memory 300 in response to receiving a read command from the CPU 100 such that data is read from the nonvolatile main memory 300. The main memory controller 200 includes a page management unit.

The nonvolatile main memory 300 operates as a main memory of the memory system 10. The nonvolatile main memory 300 may store data associated with a program that is executed in the main memory controller 200. The nonvolatile main memory 300 may store data associated with a program that is executed in the CPU 100. The nonvolatile main memory 300 may store write data provided from the CPU 100 through the main memory controller 200 and may perform a read operation on read data.

The nonvolatile main memory 300 may be a nonvolatile memory device such as a phase-change random access memory (PRAM) using a phase change material. However, an exemplary embodiment of the inventive concept is not limited thereto. For example, the nonvolatile main memory 300 may be a magnetic RAM (MRAM) using a magnetoresistive material, a resistive RAM (RRAM) using a variable resistance element formed of a complex metal oxide, a flash memory, and the like.

The host interface 400 provides an interface with a host, and the memory controller 500 provides an interface with the nonvolatile memory 600. The nonvolatile memory 600 may be used as an auxiliary memory device of the memory system 10. For example, an operating system for execution by the CPU 100 or various pieces of data generated for long-term storage by diverse programs may be stored in the nonvolatile memory 600. The nonvolatile memory 600 may allow data, which is stored by the CPU 100 or the main memory controller 200, to be read out to the nonvolatile main memory 300. The nonvolatile memory 600 may include a flash memory, a PRAM, an MRAM, a ferroelectric RAM (FRAM), an RRAM, and the like.

The modem 700 may communicate with an external device. For example, the modem 700 may communicate using various wireless communication methods such as long term evolution (LTE), code division multiple access (CDMA), Bluetooth, near field communication (NFC), Wi-Fi, radio frequency identification (RFID), and the like. The modem 700 may communicate using various wired communication methods such as a universal serial bus (USB), a serial advanced technology attachment (SATA), a serial peripheral interface (SPI), an inter-integrated circuit (I2C), high speed I2C (HS-I2C), an integrated-interchip sound (I2S), and the like.

The display driver 800 may generate a grayscale voltage corresponding to data stored in the nonvolatile main memory 300 or the nonvolatile memory 600 and may provide the display 900 with the generated grayscale voltage as a data voltage.

The display 900 may display the data voltage received from the display driver 800. For example, the display 900 may include a liquid crystal display (LCD), an organic light emitting diode (OLED) display, an active matrix OLED (AMOLED) display, a flexible display, or an electronic ink display.

Figure 2:
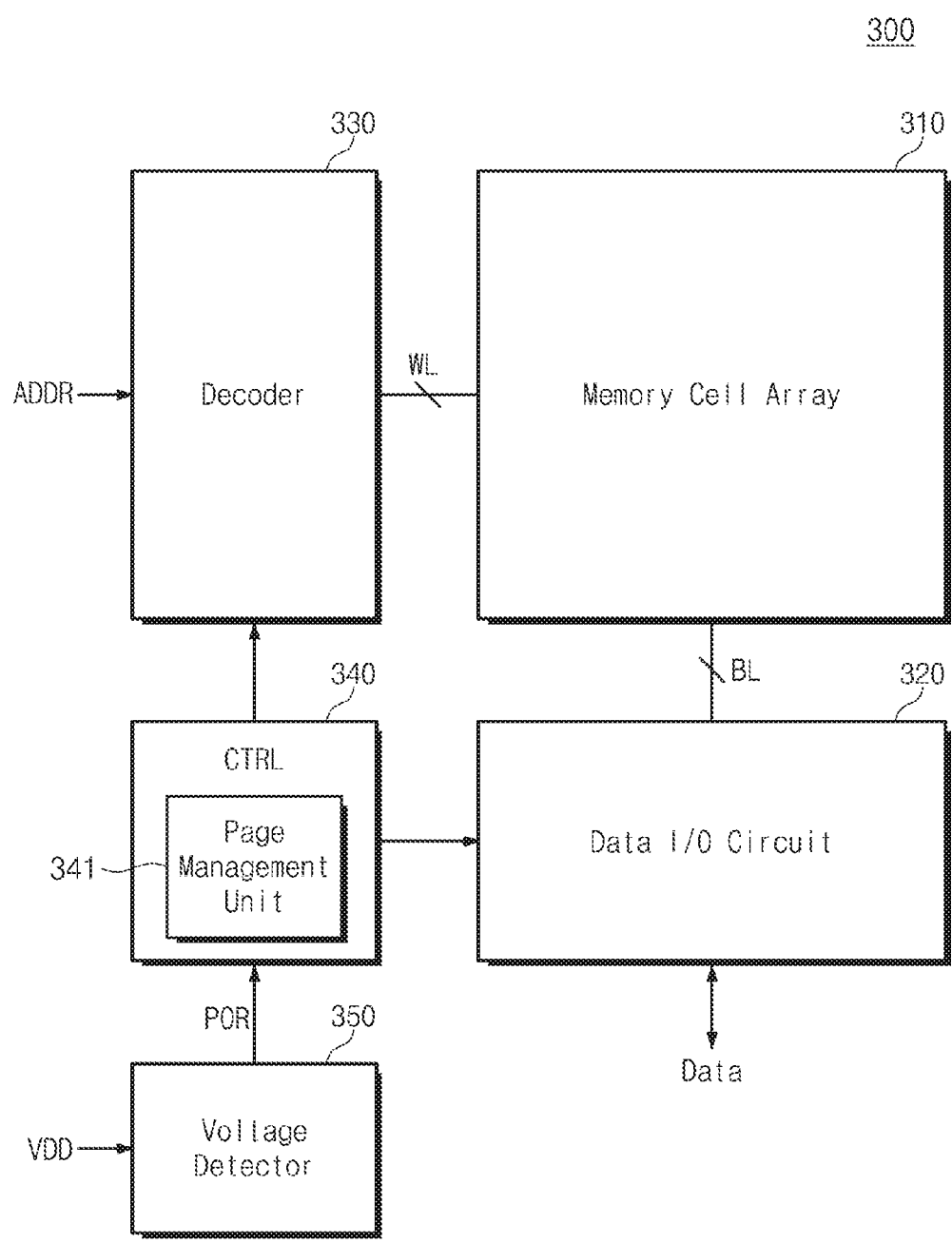
FIG. 2 is a block diagram illustrating a nonvolatile main memory of FIG. 1, according to an exemplary embodiment of the inventive concept.

FIG. 2 is a block diagram illustrating a nonvolatile main memory 300 in FIG. 1, according to an exemplary embodiment of the inventive concept. However, a structure and an operation of the nonvolatile main memory 300 in FIG. 2 may be applied to the nonvolatile memory 600 in FIG. 1 and may be also used in another nonvolatile memory.

Referring to FIG. 2, the nonvolatile main memory 300 includes a memory cell array 310, a data input/output (I/O) circuit 320, a decoder 330, control logic 340, and a voltage detector 350.

The memory cell array 310 is connected to the decoder 330 through word lines WLs and is connected to the data I/O circuit 320 through bit lines BLs. The memory cell array 310 may include a plurality of memory cells. For example, memory cells arranged in a row direction are connected to the word lines WLs and memory cells arranged in a column direction are connected to the bit lines BLs. The memory cell array 310 may store one or more bits per cell.

The data I/O circuit 320 is connected to the memory cell array 310 through the bit lines BLs. The data I/O circuit 320 operates under control of the control logic 340. The data I/O circuit 320 stores data, which is received from the outside (as Data), in the memory cell array 310. The data I/O circuit 320 reads data from the memory cell array 310 and sends the read data to the outside (as Data).

The data I/O circuit 320 may include a plurality of sense amplifier circuits and a plurality of write drivers. For example, during a read operation, each of the sense amplifier circuits may compare a data voltage, which is received through at least one of the bit lines BLs, with a reference voltage. Each of the sense amplifier circuits may output the compared result as a data signal having a digital level.

The decoder 330 is connected to the memory cell array 310 through the word lines WLs. The decoder 330 operates under control of the control logic 340. The decoder 330 selects a corresponding word line based on an address ADDR received from the outside. In other words, the decoder 330 decodes the received address ADDR and selects a corresponding word line WL by using the decoded address.

The control logic 340 controls overall operations of the nonvolatile main memory 300. For example, during a write operation, the control logic 340 controls the decoder 330 and the data I/O circuit 320 such that data received from the outside is stored in the memory cell array 310. During a read operation, the control logic 340 controls the decoder 330 and the data I/O circuit 320 such that the read operation is performed on data stored in the memory cell array 310.

The control logic 340 includes a page management unit 341. During a power on reset or power off, the page management unit 341 may determine whether to clear data stored in the memory cell array 310. The page management unit 341 determines whether to clear data stored in the memory cell array 310, in units of pages.

For example, the page management unit 341 receives a power on reset signal POR or a power off signal. The power on reset signal POR may be provided from the voltage detector 350 to the control logic 340. As the CPU 100, the main memory controller 200, or the host interface 400 detects a variation in a power supply voltage, the power off signal may be provided to the control logic 340. For example, during the power on reset, the page management unit 341 may clear or maintain the data stored in the memory cell array 310 in units of page data in response to the power on reset signal POR. A process of clearing or maintaining the stored data in units of page data will be described below in detail.

The voltage detector 350 may detect a voltage rise during the power on reset and may provide the control logic 340 with the power on reset signal POS in response to the detected voltage rise. However, an exemplary embodiment of the inventive concept is not limited thereto. For example, the voltage detector 350 may receive the power on reset signal POS from the outside of the nonvolatile main memory 300.

The voltage detector 350 may receive the power off signal from the CPU 100, the main memory controller 200, or the host interface 400 during power off and may provide the received power off signal to the control logic 340. However, an exemplary embodiment of the inventive concept is not limited thereto. For example, the voltage detector 350 may detect a voltage drop itself. Furthermore, the control logic 340 may receive the power off signal from the CPU 100, the main memory controller 200, or the host interface 400 during power off and may provide the received power off signal to the control logic 340. The nonvolatile main memory 300 may further include a tantalum capacitor to clear the stored page during power off or sudden power off.

The security when the page management unit 341 determines whether to clear the data stored in the memory cell array 310 may be higher than the security when a device outside of the nonvolatile main memory 300 controls whether to clear the data stored in the memory cell array 310. In other words, since the nonvolatile main memory 300 itself prevents important data from being leaked, security against external access to that data may be guaranteed.

Figure 3:
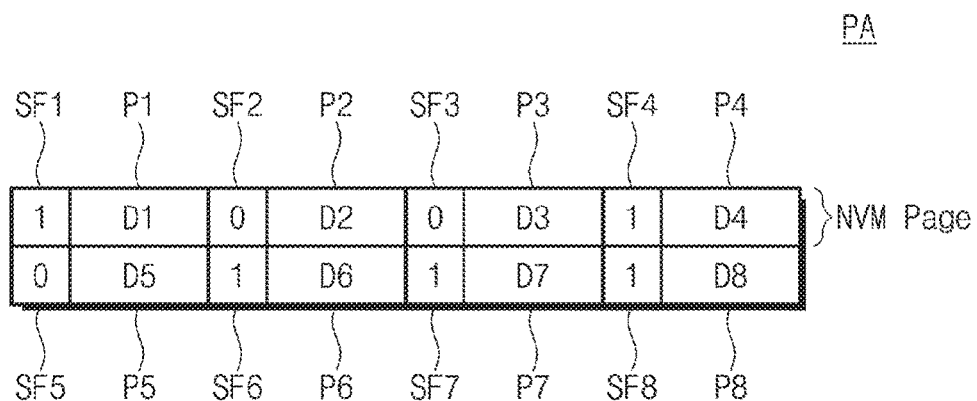
FIGS. 3 and 4 are drawings illustrating page data, according to an exemplary embodiment of the inventive concept.
Figure 4:
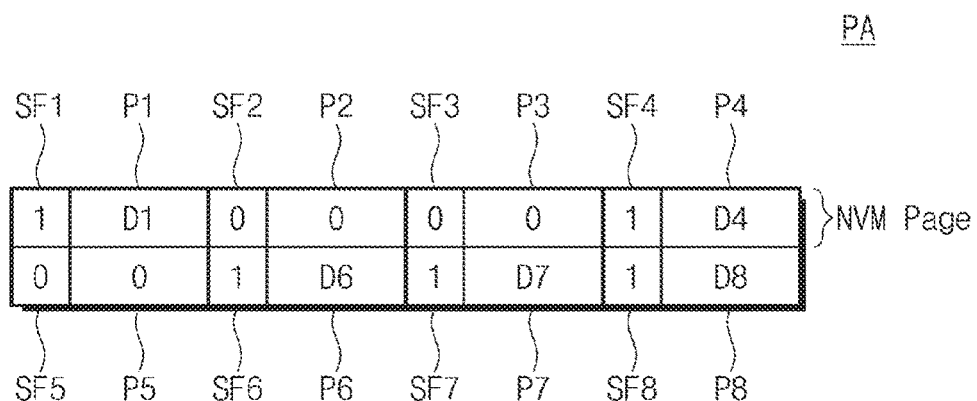

FIGS. 3 and 4 are drawings illustrating a page area PA, according to an exemplary embodiment of the inventive concept. FIG. 3 illustrates page data before the memory system 10 determines whether to clear the page data of the page area PA, and FIG. 4 illustrates page data after the memory system 10 determines whether to clear the page data of the page area PA.

Referring to FIG. 3, the page area PA includes first to eighth page data P1 to P8. The first to eighth page data P1 to P8 include first to eighth set flags SF1 to SF8, respectively. It is illustrated that the first to eighth set flags SF1 to SF8 are respectively allocated to the first to eighth page data P1 to P8 by 1 bit. However, an exemplary embodiment of the inventive concept is not limited thereto. It is also illustrated that values of the first to eighth set flags SF1 to SF8 are the first data values of the first to eighth page data P1 to P8, respectively. However, an exemplary embodiment of the inventive concept is not limited thereto. The first to eighth page data P1 to P8 have first to eighth data values D1 to D8, respectively.

The first to eighth page data P1 to P8 may have the same length. In this case, the memory system 10 may easily distinguish pieces of page data by using the number of bits corresponding to each of the pieces of page data. This may enable the memory system 10 to easily process the first to eighth page data P1 to P8.

Each of the first to eighth page data P1 to P8 corresponds to data requested during a transaction with a host. For example, the first page data P1 may be data that is write-requested during one write transaction of the host. The second page data P2 may be data that is write-requested during the next write transaction of the host. The first to fourth page data P1 to P4 may be stored in one nonvolatile memory page area NVM Page. The nonvolatile memory page area NVM Page corresponds to a read/write unit of the nonvolatile main memory 300. In other words, a length of page data corresponding to data that is requested during four transactions of the host may be a length of the nonvolatile memory page area NVM Page. However, an exemplary embodiment of the inventive concept is not limited thereto. For example, each of the first to eighth page data P1 to P8 may correspond to the nonvolatile memory page area NVM Page of the nonvolatile main memory 300.

Each of the first set flag SF1, the fourth set flag SF4, and the sixth to eighth set flags SF6 to SF8 has a data value of "1". Each of the second set flag SF2, the third set flag SF3, and the fifth set flag SF5 has a data value of "0". The data value of "0" of each of the second set flag SF2, the third set flag SF3, and the fifth set flag SF5 is a first logical value. The data value of "1" of each of the first set flag SF1, the fourth set flag SF4, and the sixth to eighth set flag SF6 to SF8 is a second logical value. In the case where a value of a set flag is the second logical value, page data corresponding to the set flag is maintained under control of the page management unit 341. In the case where the value of the set flag is the first logical value, the page data corresponding to the set flag is cleared under control of the page management unit 341.

During a power on reset or power off, the page management unit 341 may read and check the set flag. In the case where the value of the set flag is the first logical value, the page data corresponding to the set flag is overwritten with "0" or is cleared or reset under control of the page management unit 341. However, an exemplary embodiment of the inventive concept is not limited thereto. For example, under control of the page management unit 341, the page data corresponding to the set flag may be overwritten with "1" or with a dummy pattern or a random pattern.

Referring to FIG. 4, a page data value of each of the first page data P1, the fourth page data P4, and the sixth to eighth page data P6 to P8 may be maintained, and a page data value of each of the second page data P2, the third page data P3, and the fifth page data P5 may be cleared or reset. The page data value of each of the second page data P2, the third page data P3, and the fifth page data P5 may be overwritten with "0".

Unlike that described above with reference to FIG. 3, in the case where the data value of the set flag is the second logical value (e.g., "1"), the page data corresponding to the set flag is cleared or reset under control of the page management unit 341. In the case where the data value of the set flag is the first logical value, the page data corresponding to the set flag is maintained under control of the page management unit 341. In this case, a page data value of each of the first page data P1, the fourth page data P4, and the sixth to eighth page data P6 to P8 may be cleared or reset.

The data values of the first to eighth set flags SF1 to SF8 of the first to eighth page data P1 to P8 may be sequentially examined by the page management unit 341. For example, the page management unit 341 may determine whether to clear the first to eighth page data P1 to P8, in an address order.

Each page data may include an error correction code (ECC). The memory system 10 may correct an error of data read from the nonvolatile main memory 300 by using the ECC. The set flag may be arranged adjacent to the ECC.

Important data may be cleared in the nonvolatile main memory 300 during booting of the memory system 10 by allocating the set flag in the page data. In this case, the important data may be prevented from being exposed to an outside source. In addition, since data of which importance is low is not cleared in the nonvolatile main memory 300, a power consumption of the memory system 10 due to setting the nonvolatile main memory 300 again may be reduced.

In FIGS. 3 and 4, it is assumed that the memory system 10 includes a nonvolatile main memory. However, an exemplary embodiment of the inventive concept is not limited thereto. The memory system 10 may be applied to diverse devices which may use a nonvolatile memory as an auxiliary memory device.

Figure 5:
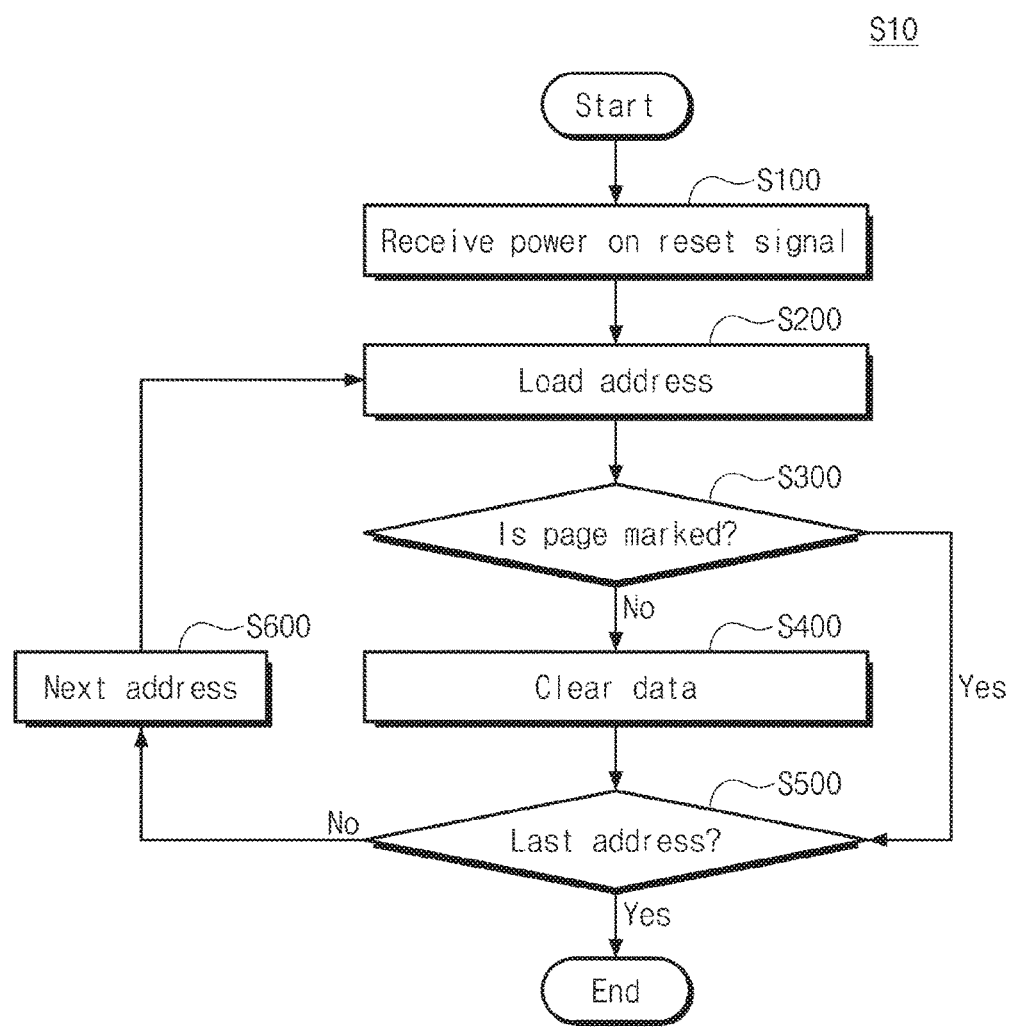
FIG. 5 is a flowchart for describing an operation of a memory system, according to an exemplary embodiment of the inventive concept.

FIG. 5 is a flowchart for describing an operation of a memory system, according to an exemplary embodiment of the inventive concept.

Referring to FIG. 5, a method S10 of operating a nonvolatile main memory equipped system includes receiving a power on reset signal (S100), loading an address (S200), determining whether a page is marked (S300), clearing data (S400), determining whether the address is a last address (S500), and assigning the next address (S600).

In operation S100, the page management unit 341 receives a power on reset signal POR from the voltage detector 350. It is to be understood, however, that the page management unit 341 may receive a power off signal from the voltage detector 350 or the outside, in operation S100.

In operation S200, the nonvolatile main memory 300 receives an address ADDR. The CPU 100 provides the address ADDR to the main memory controller 200. The nonvolatile main memory 300 may select a first address from the main memory controller 200 as a start address. However, an exemplary embodiment of the inventive concept is not limited thereto. For example, the nonvolatile main memory 300 may select a last address from the main memory controller 200 as the start address.

In operation S300, the page management unit 341 reads and checks a set flag value of page data corresponding to the address. In reference to FIGS. 3 and 4, in the case where the set flag value is a second logical value, the corresponding page data is marked. In the case where the set flag value is a first logical value, the corresponding page data is not marked. In the case where the corresponding page data is marked, the process proceeds to operation S500. In the case where the corresponding page data is not marked, the process proceeds to operation S400.

In operation S400, the page management unit 341 controls the nonvolatile main memory 300 to clear the page data. In operation S400, the page data may be overwritten with "0" or may be overwritten with a dummy pattern or a random pattern.

In operation S500, when an address corresponding to the page data, which is cleared or maintained, is the last address, the method S10 is ended. When the address corresponding to a page in which data is cleared or in which the data is maintained is not the last address, the process proceeds to operation S600.

In operation S600, the CPU 100 assigns the next address and proceeds to operation S200. In the embodiments of FIGS. 3 and 4, when an address corresponding to a first page data P1 is the start address and an address corresponding to an eighth page data P8 is the last address, the page management unit 341 may sequentially determine whether to overwrite, clear, or reset the first page data P1 to eighth page data P8.

Figure 6:
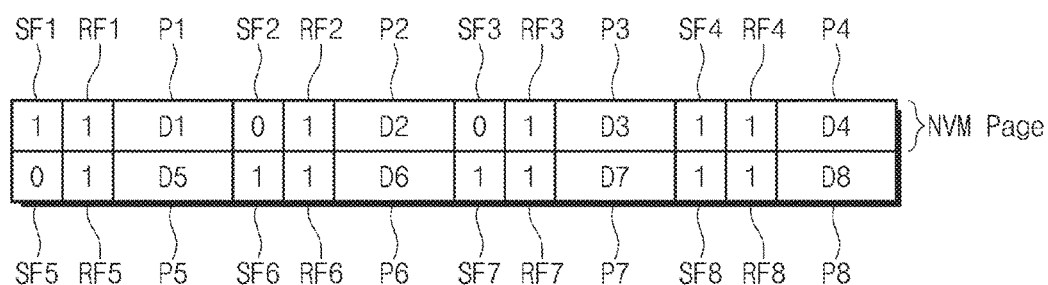
FIGS. 6 and 7 are drawings illustrating page data, according to an exemplary embodiment of the inventive concept.
Figure 7:
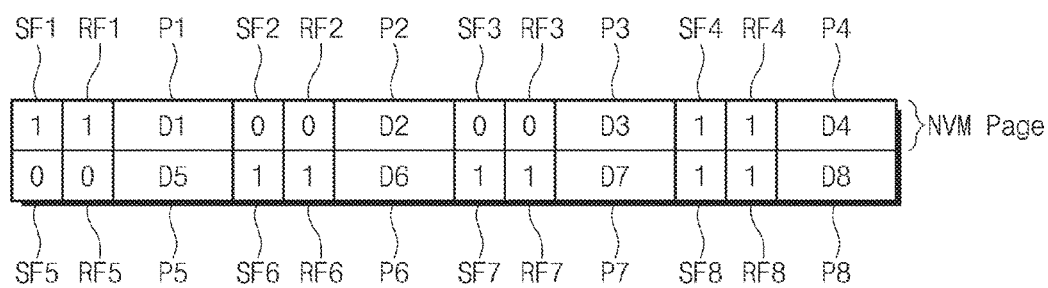

FIGS. 6 and 7 are drawings illustrating a page area PA_1, according to an exemplary embodiment of the inventive concept. FIG. 6 illustrates page data before the memory system 10 determines whether to clear page data of the page area PA_1, and FIG. 7 illustrates page data after the memory system 10 determines whether to clear page data of the page area PA_1.

Referring to FIG. 6, the page area PA_1 includes first to eighth page data P1 to P8. The first to eighth page data P1 to P8 include first to eighth set flags SF1 to SF8, respectively. The first to eighth page data P1 to P8 of FIG. 6 further include first to eighth read flags RF1 to RF8, respectively.

The page management unit 341 determines whether to permit page data corresponding to the read flag RF to be read, based on a value of the read flag RF. The read flags RFs of FIG. 6 have the data value of "1". When the main memory controller 200 writes each page data, each of the first to eighth read flags RF1 to RF8 may be written with "1". However, an exemplary embodiment of the inventive concept is not limited thereto. For example, each of the first to eighth read flags RF1 to RF8 may be written with "0". A data value of "0" may be a first logical value, and the data value of "1" may be a second logical value. In the case where a data value of a read flag RF is the second logical value, the page data corresponding to the read flag RF is read out under control of the page management unit 341 of FIG. 6. In other words, each of the first to eighth data values D1 to D8 may be read out.

Referring to FIG. 7, each of the first read flag RF1, the fourth read flag RF4, and the sixth to eighth read flags RF6 to RF8 has the second logical value, and each of the second read flag RF2, the third read flag RF3, and the fifth read flag RF5 has the first logical value.

In the case where a data value of a set flag SF is the first logical value (e.g., 0), the read flag RF of the page data corresponding to the set flag SF is changed to the second logical value (e.g., 1) under control of the page management unit 341. In other words, the data value of the read flag may be deleted based on a value of the set flag. In the case where the data value of the read flag has the first logical value, the corresponding page data is not read under control of the page management unit 341. For example, even though the CPU 100 provides a read command, the nonvolatile main memory 300 does not perform a read operation by using the page management unit 341.

The page management unit 341 may ignore the read command of the page data corresponding to the read flag or may output a dummy pattern or a random pattern based on the read command.

Even though each of the second set flag SF2, the third set flag SF3, and the fifth set flag SF5 has the first logical value, each of the second data value D2, the third data value D3, and the fifth data value D5 may not be deleted. However, each of the second data value D2, the third data value D3, and the fifth data value D5 may not be read out.

Important data may be prevented from external exposure by allocating the read flag RF to the page data. For example, the important data is not read from the nonvolatile main memory 300 and is ignored after only the data value of the read flag is read, thereby reducing a power consumption of the memory system 10. Moreover, in the case where the read flag RF is allocated to the page data, a procedure of clearing page data by using the set flag is omitted, and thus, a booting time of the memory system 10 may be reduced.

In FIGS. 6 and 7, it is assumed that the memory system 10 includes a nonvolatile main memory. However, an exemplary embodiment of the inventive concept is not limited thereto. For example, the memory system 10 may be applied to diverse devices which use a nonvolatile memory as an auxiliary memory device.

Figure 8:
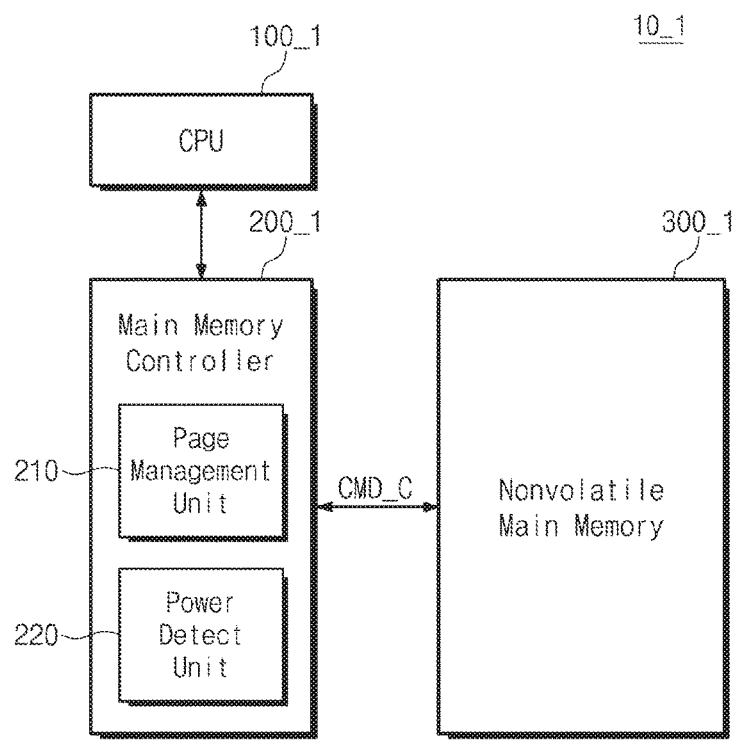
FIGS. 8, 9 and 10 are block diagrams illustrating a memory system, according to an exemplary embodiment of the inventive concept.

FIG. 8 is a block diagram illustrating a memory system 10_1, according to an exemplary embodiment of the inventive concept. Referring to FIG. 8, the memory system 10_1 includes a CPU 100_1, a main memory controller 200_1, and a nonvolatile main memory 300_1.

The CPU 100_1 provides a logical address to the main memory controller 200_1. The main memory controller 200_1 changes the logical address to a physical address and provides the physical address to the nonvolatile main memory 300_1. The main memory controller 200_1 may change the logical address to the physical address based on an address translation table.

The main memory controller 200_1 includes a page management unit 210 and a power detect unit 220. In this case, control logic of the nonvolatile main memory 300_1 may not include a separate page management unit.

The page management unit 210 may determine whether to clear data stored in the nonvolatile main memory 300_1. The page management unit 210 may determine whether to clear the data stored the nonvolatile main memory 300_1, in units of page data. The page management unit 210 may determine whether to clear page data corresponding to a set flag by checking a value of the set flag of a page area corresponding to a corresponding address.

In this case, the page management unit 210 may check the set flag value of the page data corresponding to an address from a start address to a last address. The address from the start address to the last address may be a part of a whole address. The whole address may be a logical address. However, an exemplary embodiment of the inventive concept is not limited thereto. For example, the whole address may be a physical address. The start address may be an address, which is previously set, such that an external device fails to change the start address. The remaining address other than the address from the start address to the last address may be an address corresponding to a memory allocated in a kernel, etc.

The page management unit 210 may manage whether to clear page data of the nonvolatile main memory 300_1, in units of page data by providing the control logic of the nonvolatile main memory 300_1 with a clear command CMD_C. In this case, the page management unit 210 provides the clear command CMD_C such that the nonvolatile main memory 300_1 clears the page data after recognizing the existence of the set flag not directly clearing the page data. Furthermore, in the case where a read flag is allocated to the page data, the page management unit 210 may provide a command such that the nonvolatile main memory 300_1 ignores the page data after recognizing the existence of the read flag.

Alternatively, the page management unit 210 may directly clear the page data. In other words, the page management unit 210 may read the page data from the nonvolatile main memory 300_1 by providing the nonvolatile main memory 300_1 with a read command. In the case where the set flag has a first logical value, the page management unit 210 may provide the nonvolatile main memory 300_1 with the clear command CMD_C to clear the page data corresponding to the set flag. In addition, in the case where the read flag is allocated to the page data, the page management unit 210 may read the page data from the nonvolatile main memory 300_1 by providing the nonvolatile main memory 300_1 with the read command. In the case where the read flag has the first logical value, the page management unit 210 may provide a command to ignore the page data corresponding to the read flag.

The power detect unit 220 may detect a power on reset or power off. The power detect unit 220 may provide a power on reset signal or a power off signal to the page management unit 210. However, an exemplary embodiment of the inventive concept is not limited thereto. For example, the main memory controller 200_1 may receive the power on reset signal or the power off signal from the outside, not through the power detect unit 220. Further, the main memory controller 200_1 may not include the power detect unit 220.

Figure 9:
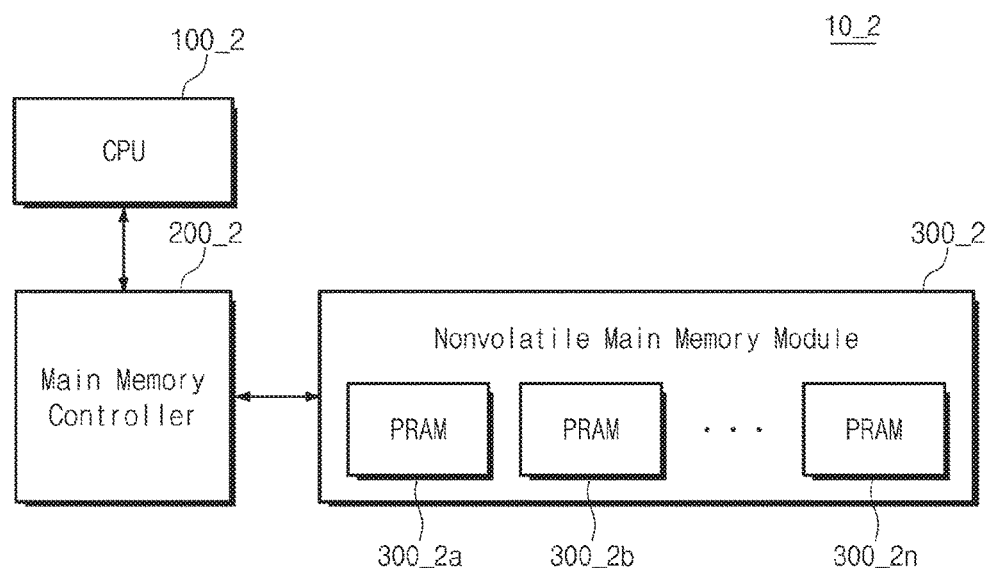

FIG. 9 is a block diagram illustrating a memory system 10_2, according to an exemplary embodiment of the inventive concept. For example, the memory system 10_2 of FIG. 9 illustrates a case where a nonvolatile main memory is a memory module.

Referring to FIG. 9, the memory system 10_2 includes a CPU 100_2, a main memory controller 200_2, and a nonvolatile main memory module 300_2. The nonvolatile main memory module 300_2 includes a plurality of memory chips 300_2a to 300_2n. In an exemplary embodiment of the inventive concept, the memory chips 300_2a to 300_2n are PRAMs.

The memory system 10_2 may perform a clear operation on important data in the plurality of memory chips 300_2a to 300_2n during a power on reset or power off. Accordingly, the important data may be prevented from leakage.

The plurality of memory chips 300_2a to 300_2n may perform a write operation in parallel. The plurality of memory chips 300_2a to 300_2n may include page management units each of which determines whether to clear data, respectively. Alternatively, the main memory controller 200_2 may itself include a page management unit to manage pieces of data of the plurality of memory chips 300_2a to 300_2n in units of pages.

Figure 10:
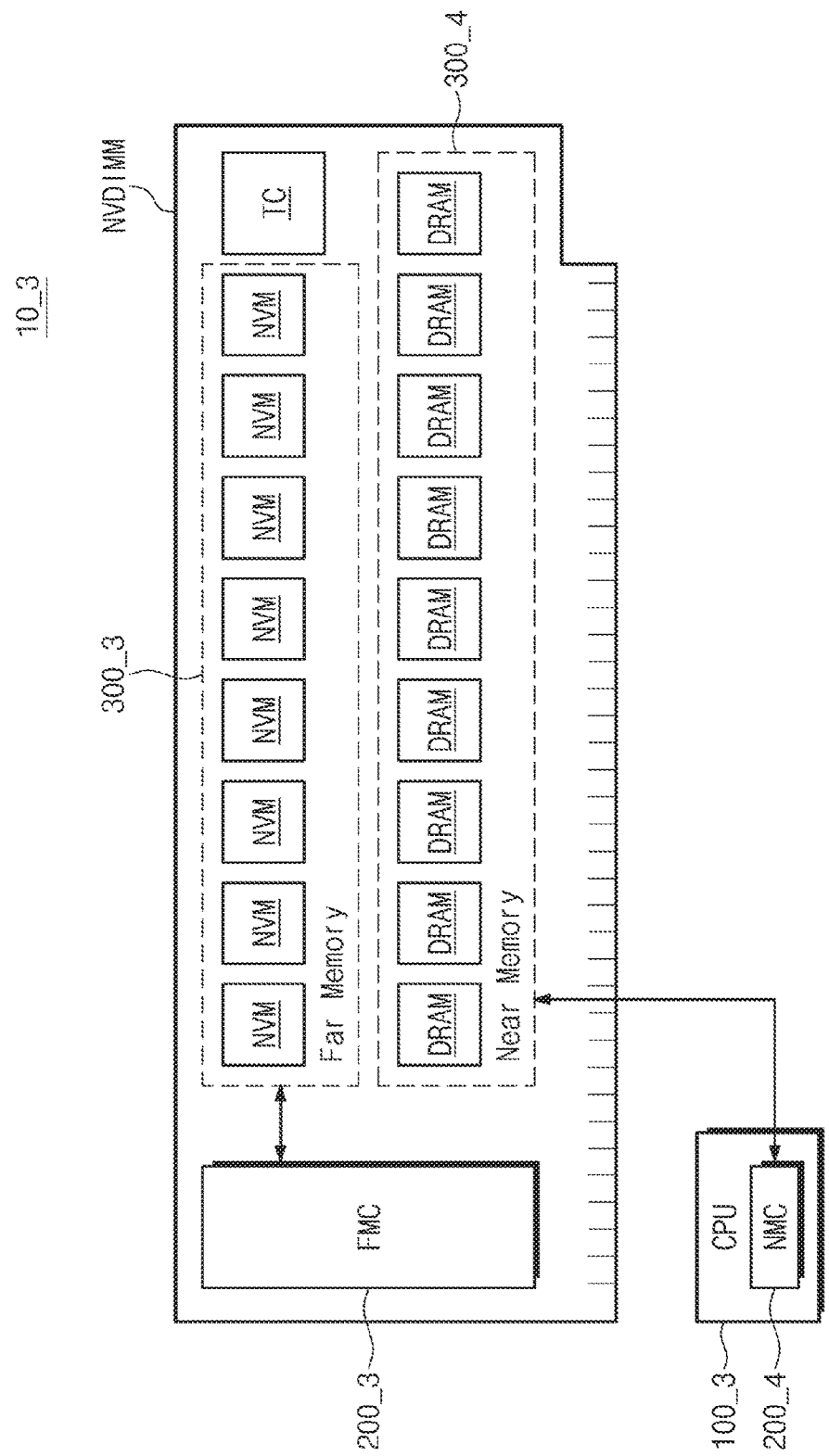

FIG. 10 is a block diagram illustrating a memory system 10_3, according to an exemplary embodiment of the inventive concept.

Referring to FIG. 10, the memory system 10_3 includes a CPU 100_3 and a non-volatile dual in-line memory module (NVDIMM). The CPU 100_3 includes a near memory controller 200_4. The NVDIMM includes a far memory controller 200_3, a far memory 300_3, a near memory 300_4, and a tantalum capacitor TC.

The near memory 300_4 includes a volatile memory. For example, the near memory 300_4 may include a DRAM. The near memory 300_4 may include a plurality of volatile memory chips, e.g., a plurality of DRAM chips. The far memory 300_3 includes a nonvolatile memory. For example, the far memory 300_3 may include a PRAM or a flash memory. The far memory 300_3 may include a plurality of nonvolatile memory chips.

The near memory 300_4 is controlled by the near memory controller 200_4. The far memory 300_3 is controlled by the far memory controller 200_3. A hybrid main memory such as the NVDIMM may have a high speed of a volatile memory and may retain data stored therein even at power-off. In other words, the memory system 10_3 of FIG. 10 may support certain data in nonvolatile fashion and may enable a high-speed characteristic to be imparted to certain data. In addition, the memory system 10_3 may connect with the NVDIMM and the CPU 100_3 through a DIMM interface, and thus, the memory system 10_3 may have an increased communication speed.

The far memory 300_3 may include a page management unit that determines whether to clear data stored in the far memory 300_3. Alternatively, the far memory controller 200_3 includes the page management unit, and the page management unit of the far memory controller 200_3 may manage data, which is stored in the far memory 300_3, in units of page data.

Since data is cleared when a power is removed, the near memory 300_4 may not include a separate page management unit. In addition, the CPU 100_3 provides a length of a page provided to the far memory 300_3 to be different from a length of a page provided to the near memory 300_4. Therefore, the near memory 300_4 may receive data that has an amount other than an amount of data corresponding to a set flag (or a read flag) of the far memory 300_3.

The tantalum capacitor TC may power the far memory 300_3 during power off. In other words, if it is determined to clear page data during power off, the tantalum CAP TC may power the far memory 300_3, and thus, an operation of clearing the page data may be performed.

Figure 11:
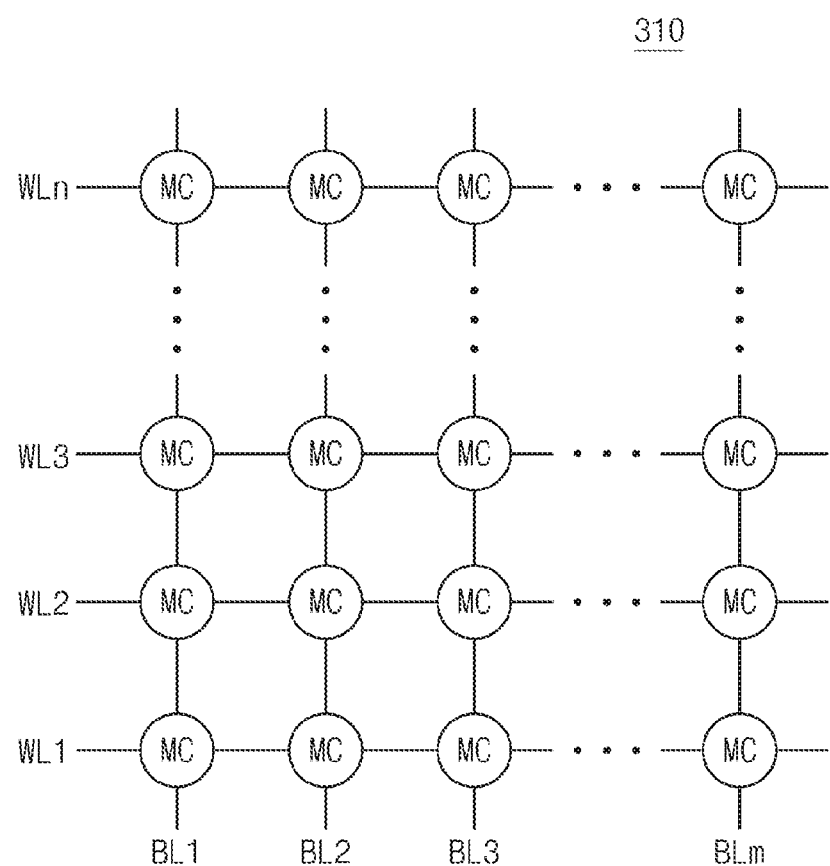
FIGS. 11 and 12 are drawings for describing a memory cell array, according to an exemplary embodiment of the inventive concept.
Figure 12:
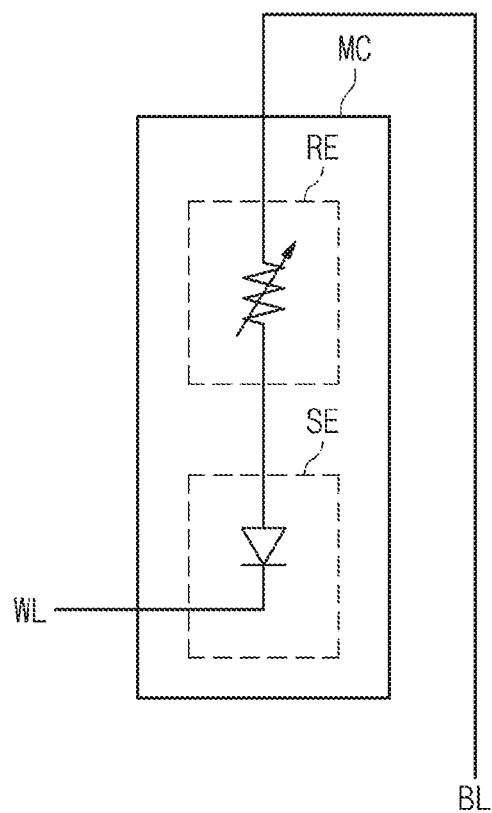

FIG. 11 is a block diagram of a memory cell array 310 in FIG. 2 according to an exemplary embodiment of the inventive concept. FIG. 12 is a circuit diagram of a memory cell MC in FIG. 11 according to an exemplary embodiment of the inventive concept.

Referring to FIG. 11, memory cells MC are provided along row and column directions. The memory cells MC arranged in the row direction are connected to word lines WL1 to WLn. The memory cells arranged in the column direction are connected to bit lines BL1 to BLm. For example, memory cells MCs corresponding to one word line may correspond to pieces of page data. The memory cells MC corresponding to one word line may correspond to a nonvolatile memory page area NVM Page in FIG. 3.

Referring to FIG. 12, a memory cell MC is connected between the word line WL and the bit line BL. The memory cell MC includes a selection element SE and a resistance element RE.

The selection element SE determines whether to electrically connect the word line WL with the resistance element RE. When the memory cell MC is selected, the selection element SE electrically connects the word line WL with the resistance element RE. In other words, the word line WL and the bit line BL are electrically connected through the resistance element RE. In an exemplary embodiment of the inventive concept, when the memory cell MC is not selected, the selection element SE electrically separates the word line WL from the resistance element RE.

In an exemplary embodiment of the inventive concept, the selection element SE is a diode. In the case where a voltage difference between the bit line BL and the word line WL is set to be higher than a threshold voltage of the diode, the memory cell MC may be selected. In the case where the voltage difference between the bit line BL and the word line WL is set to be lower than a threshold voltage of the diode, the memory cell MC may not be selected.

In an exemplary embodiment of the inventive concept, the resistance element RE is a variable resistor. The resistance element RE may have a resistance value that varies according to an ambient environment. The resistance element RE may store data in the form of a plurality of resistance values. For example, the resistance element RE may have at least '$2^i$' resistance values to store data of 'i' bits.

The resistance element RE may have a resistance value that varies according to a current or a voltage. Alternatively, the resistance element RE may have a resistance value that varies according to a temperature. For example, the resistance element RE may have a resistance value that varies through a phase change such as chalcogenide. A nonvolatile memory including the memory cell MC may be, but is not limited to, a PRAM.

The memory cell MC may have a low resistance value and a high resistance value. The memory cell MC having the low resistance value may be in a reset state. The memory cell MC having the high resistance value may be in a set state. However, an exemplary embodiment of the inventive concept is not limited thereto. For example, the memory cell MC may have various resistance values between a low resistance state and a high resistance state, and the memory cell MC may have various states between the reset state and the set state.

The set state of the memory cell MC is set based on data DATA and an address ADDR provided by the CPU 100 or the main memory controller 200. Furthermore, the reset state of the memory cell MC may be determined under control of the control logic 340 of FIG. 2 or the main memory controller 200_1 of FIG. 8.

A memory system according to an exemplary embodiment of the inventive concept may include a nonvolatile memory. According to an exemplary embodiment of the inventive concept, important data (e.g., data requiring security, or high security data) stored in a nonvolatile memory may be prevented from being accessed by an unwanted party.

While the inventive concept has been described with reference to exemplary embodiments thereof, it will be apparent to those skilled in the art that various changes and modifications may be made thereto without departing from the spirit and scope of the inventive concept. Therefore, it should be understood that the above embodiments are not limiting, but illustrative.

What is claimed is:

1. A nonvolatile memory, comprising:
    a memory cell array comprising a plurality of nonvolatile memory cells;
    a decoder connected to the memory cell array through a plurality of word lines;
    a data input/output (I/O) circuit connected to the memory cell array through a plurality of bit lines; and
    control logic configured to control the decoder and the data I/O circuit in response to a change in a power supply voltage to clear or maintain individual pieces of page data,
    wherein the control logic comprises a page management unit that determines whether to clear data included in the individual pieces of page data based on a value of a set flag respectively corresponding to the individual pieces of page data.

2. The nonvolatile memory of claim 1, wherein the page data is data that a host requests during one transaction.

3. The nonvolatile memory of claim 1, wherein the page management unit controls the decoder and the data I/O circuit to clear data in a piece of page data if its corresponding set flag has a first logical value, and
    wherein the page management unit controls the decoder and the data I/O circuit to maintain the data in a piece of page data if its corresponding set flag has a second logical value.

4. The nonvolatile memory of claim 3, wherein the page management unit controls the decoder and the data I/O circuit to overwrite the pieces of the page data corresponding to the set flag of the first logical value with '0', a dummy pattern, or a random pattern.

5. The nonvolatile memory of claim 1, wherein the page management unit determines whether to permit reading of the individual pieces of page data, based on a read flag value respectively corresponding to the individual pieces of page data.

6. The nonvolatile memory of claim 5, wherein the page management unit changes a first read flag value into a first logical value if a first set flag corresponding to the first read flag has the first logical value, and wherein the page management unit controls the decoder and the data I/O circuit not to read data included in a piece of page data corresponding to the first read flag if the first read flag value has the first logical value.

7. The nonvolatile memory of claim 6, wherein the page management unit changes the first read flag value from a second logical value to the first logical value if the first read flag has the second logical value and first set flag has the first logical value.

8. The nonvolatile memory of claim 6, wherein the page management unit controls the decoder and the data I/O circuit to ignore first page data corresponding to the first read flag or to output a dummy pattern or a random pattern if the first read flag value is the first logical value.

9. The nonvolatile memory of claim 1, wherein the page management unit determines whether to clear the individual pieces of page data, during a power on reset.

10. The nonvolatile memory of claim 1, wherein the page management unit determines whether to clear the individual pieces of page data, in response to a power off signal.

11. A memory system, comprising:
a nonvolatile memory; and
a memory controller configured to control the nonvolatile memory to clear or maintain page data written in a plurality of pages in response to a change in a power supply voltage,
wherein the memory controller comprises a page management unit configured to determine whether to clear the page data, based on a value of a set flag respectively corresponding to individual pieces of the page data.

12. The memory system of claim 11, wherein the page management unit reads the page data from the nonvolatile memory, clears the pieces of page data having a set flag of a first logical value, and maintains the pieces of page data having a set flag of a second logical value.

13. The memory system of claim 11, wherein the page management unit provides the nonvolatile memory with a clear command in response to the change in the power supply voltage, and wherein the nonvolatile memory clears the page data in response to the clear command.

14. The memory system of claim 11, further comprising:
a volatile memory configured to store the page data written in the nonvolatile memory.

15. The memory system of claim 11, wherein the value of an individual set flag is provided to the memory controller together with its corresponding page data.

16. A nonvolatile memory, comprising:
a memory cell array;
a decoder connected to the memory cell array via word lines;
a data input/output (I/O) circuit connected to the memory cell array via bit lines; and
control logic circuit configured to clear individual pieces of page that have a corresponding set flag of a first logical value and to maintain individual pieces of page data that have a corresponding set flag of a second logical value, wherein the page data is cleared or maintained in response to a signal indicative of a power supply voltage change.

17. The nonvolatile memory of claim 16, wherein page data corresponding to high security data is cleared during a system boot, and page data corresponding to low security data is not cleared during the system boot.

18. The nonvolatile memory of claim 16, wherein the signal indicative of a power supply voltage change includes a power on reset or power off.

19. The nonvolatile memory of claim 16, further comprising a capacitor to clear the page data during power off or sudden power off.

20. A memory system including the nonvolatile memory of claim 16 as a main memory.

* * * * *